(12) United States Patent
Zhou et al.

(10) Patent No.: US 9,966,428 B2
(45) Date of Patent: May 8, 2018

(54) CAPACITOR AND FABRICATION METHOD THEREOF

(71) Applicant: UNITED MICROELECTRONICS CORP., Hsin-Chu (TW)

(72) Inventors: Zhibiao Zhou, Singapore (SG); Shao-Hui Wu, Singapore (SG); Chi-Fa Ku, Kaohsiung (TW); Chen-Bin Lin, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 14/996,244

(22) Filed: Jan. 15, 2016

(65) Prior Publication Data

US 2017/0170256 A1 Jun. 15, 2017

(30) Foreign Application Priority Data

Dec. 10, 2015 (TW) .............................. 104141415 A (51) Int. Cl.
*H01L 49/02* (2006.01)

(52) U.S. Cl.
CPC ................... *H01L 28/91* (2013.01)

(58) Field of Classification Search
CPC ...................................................... H01G 4/01
See application file for complete search history.

(56) References Cited

U.S. PATENT DOCUMENTS

| 4,700,457 | A | * | 10/1987 | Matsukawa | ....... | H01L 27/10805 |
| | | | | | | 148/DIG. 14 |
| 4,914,546 | A | * | 4/1990 | Alter | .................... | H01L 27/0805 |
| | | | | | | 257/306 |
| 5,903,023 | A | * | 5/1999 | Hoshi | .................... | C23C 14/046 |
| | | | | | | 257/296 |
| 6,064,108 | A | * | 5/2000 | Martinez | ............. | H01L 23/5223 |
| | | | | | | 257/532 |
| 8,889,522 | B2 | | 11/2014 | Kang et al. | | |
| 8,963,287 | B1 | | 2/2015 | Tian et al. | | |
| 8,975,678 | B2 | | 3/2015 | Kawashima et al. | | |
| 9,012,967 | B2 | | 4/2015 | Lin et al. | | |
| 2002/0084471 | A1 | * | 7/2002 | Won | ........................ | H01L 28/91 |
| | | | | | | 257/200 |
| 2008/0055816 | A1 | * | 3/2008 | Park | ........................ | H01G 4/08 |
| | | | | | | 361/301.4 |
| 2011/0070718 | A1 | * | 3/2011 | Kim | ........................ | H01L 28/60 |
| | | | | | | 438/399 |

(Continued)

*Primary Examiner* — Erik Kielin
(74) *Attorney, Agent, or Firm* — Winston Hsu (57) ABSTRACT

A method for fabricating capacitor is disclosed. The method includes the steps of: providing a material layer; forming a first conductive layer, a first dielectric layer, and a second conductive layer on the material layer; patterning the first dielectric layer and the second conductive layer to form a patterned first dielectric layer and a middle electrode; forming a second dielectric layer on the first conductive layer and the middle electrode; removing part of the second dielectric layer to form a patterned second dielectric layer; forming a third conductive layer on the first conductive layer and the patterned second dielectric layer, wherein the third conductive layer contacts the first conductive layer directly; and removing part of the third conductive layer to expose part of the patterned second dielectric layer.

10 Claims, 6 Drawing Sheets

(56) References Cited

U.S. PATENT DOCUMENTS

| | | | | |
|---|---|---|---|---|
| 2011/0297941 A1* | 12/2011 | Zhan | ........................ | H01L 28/87 257/59 |
| 2013/0127012 A1* | 5/2013 | Koo | ........................ | H01L 28/91 257/532 |
| 2015/0295019 A1* | 10/2015 | Wang | .................. | H01L 27/0805 257/532 |

* cited by examiner

CAPACITOR AND FABRICATION METHOD THEREOF

BACKGROUND OF THE INVENTION

1. Field of the Invention

The invention relates to capacitor and fabrication method thereof, and more particularly, to a metal-insulator-metal (MIM) capacitor and fabrication method thereof.

2. Description of the Prior Art

In semiconductor manufacturing processes, metal capacitors formed of metal-insulator-metal (MIM) are widely used in the design of ultra large scale integrations (ULSI). Because a MIM capacitor has low resistance and low parasitic capacitance, and has no problems in shifts of depletion induced voltage, MIM capacitors have become the main structure used for metal capacitors. It is therefore important to develop a MIM capacitor that comprises copper electrodes with low resistance.

With the increasing complexity of integrated circuits, the multilevel interconnect process has become the typical method used in semiconductor integrated circuit fabrication. To satisfy the requirements for high integration and high speed in integrated circuits (ICs), especially in a deep sub-micro (<0.18 µm) semiconductor process, a copper (Cu) dual damascene process is becoming more widely used as a standard process in forming an interconnection line within the inter-metal dielectric layer of low dielectric constant (low k) materials. Since copper has both a low resistance and a low electro-migration resistance, the low k materials are useful in improving the RC delay effect of a metal interconnection. Consequently, how to integrate copper fabrication processes to fabricate MIM capacitors and internal metal wires with low resistance has become a key research topic in this field.

SUMMARY OF THE INVENTION

According to a preferred embodiment of the present invention, a method for fabricating capacitor is disclosed. The method includes the steps of: providing a material layer; forming a first conductive layer, a first dielectric layer, and a second conductive layer on the material layer; patterning the first dielectric layer and the second conductive layer to form a patterned first dielectric layer and a middle electrode; forming a second dielectric layer on the first conductive layer and the middle electrode; removing part of the second dielectric layer to form a patterned second dielectric layer; forming a third conductive layer on the first conductive layer and the patterned second dielectric layer, wherein the third conductive layer contacts the first conductive layer directly; and removing part of the third conductive layer to expose part of the patterned second dielectric layer.

According to another aspect of the present invention, a capacitor is disclosed. The capacitor includes: a bottom electrode; a middle electrode on the bottom electrode; a patterned first dielectric layer between the bottom electrode and the middle electrode; a top electrode on the bottom electrode and the middle electrode, wherein the top electrode contacts the bottom electrode directly; and a patterned second dielectric layer between the middle electrode and the top electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
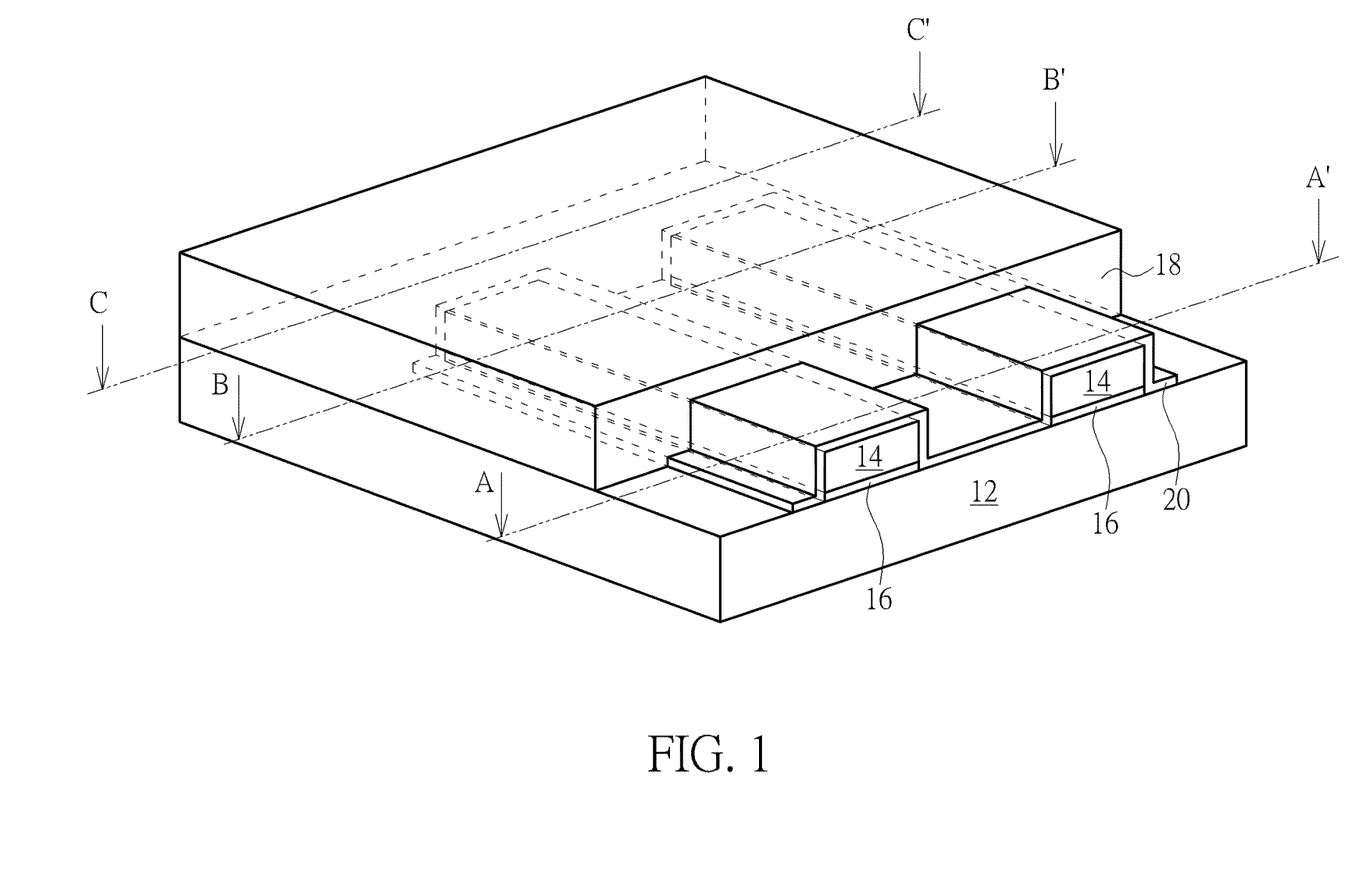
FIG. 1 illustrates a 3D structural view of a capacitor device according to a preferred embodiment of the present invention.
Figure 2:
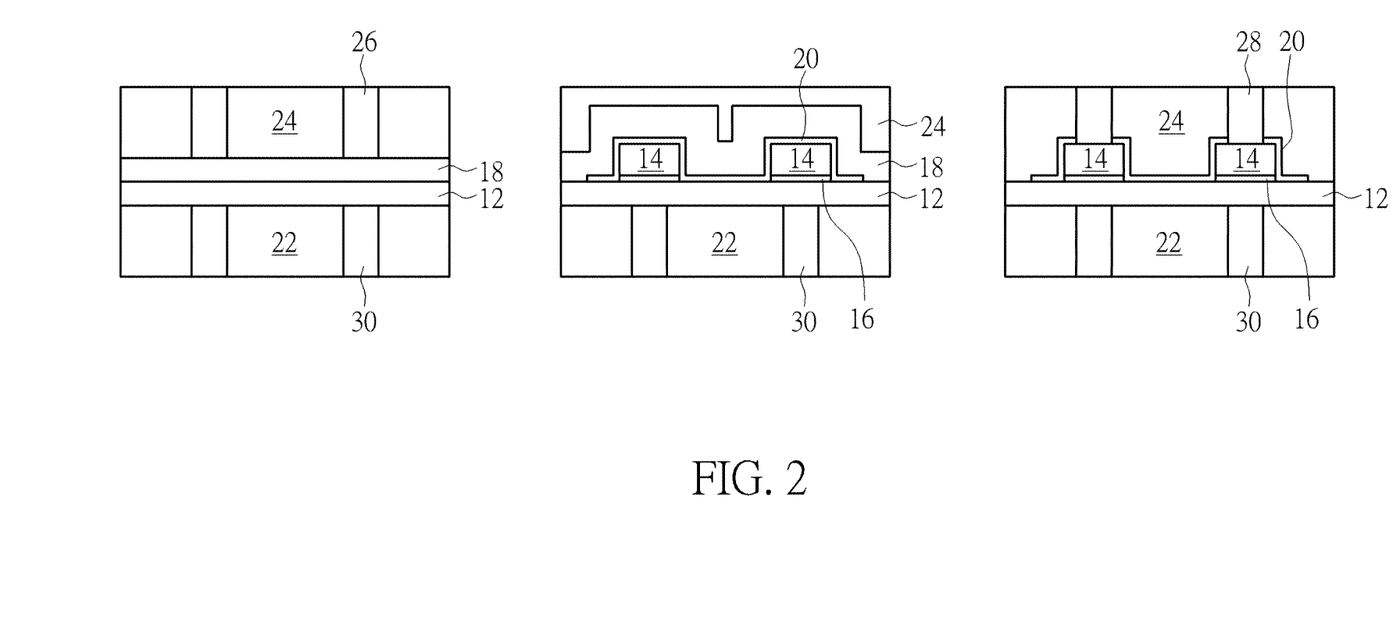
FIG. 2 illustrates cross-sectional views of FIG. 1

Referring to FIGS. 1-2, FIG. 1 illustrates a 3D structural view of a capacitor device according to a preferred embodiment of the present invention, the right portion of FIG. 2 illustrates a cross-sectional view of FIG. 1 along the sectional line AA', the middle portion of FIG. 2 illustrates a cross-sectional view of FIG. 1 along the sectional line BB', and the left portion of FIG. 2 illustrates a cross-sectional view of FIG. 1 along the sectional line CC'. For simplicity reason, it is to be noted that contact plugs and material layer surrounding the contact plugs are only revealed in FIG. 2 and omitted in FIG. 1. As shown in FIG. 1, the capacitor of the present invention preferably includes a bottom electrode 12, two middle electrodes 14 disposed on the bottom electrode 12, a first capacitor dielectric layer 16 disposed between the bottom electrode 12 and the middle electrodes 14, a top electrode 18 disposed on the bottom electrode 12 and middle electrodes 14, and a second capacitor dielectric layer 20 disposed between the middle electrodes 14 and the top electrode 18.

It should be noted that even though the middle electrodes 14 disclosed in this embodiment do not contact each other and only two middle electrodes 14 are disclosed in this embodiment, the shape an quantity of the middle electrodes 14 are not limited to the ones disclosed in this embodiment, but could be adjusted according to the demand of the product. For instance, each of the middle electrodes 14 could be physically connected to each other, and the connected portion could be exposed or covered by the second capacitor dielectric layer 20 and top electrode 18. In addition, the top electrode 18 is preferably disposed on the middle electrodes 14 while contacting part of the bottom electrode 12 at the same time, the top electrode 18 only covers part of the middle electrodes 14, or at least one edge of the top electrode 18 is aligned to an edge of the bottom electrode 12. As shown in FIG. 1, the top electrode 18 is in physical contact with the bottom electrode 12 and three edges of the top electrode 18 are aligned with three edges of the bottom electrode 12 at the same time.

In this embodiment, the bottom electrode 12 could be disposed on a material layer 22 and another material layer 24 could be disposed on the top electrode 18, in which the material layer 22 and 24 could be composed of same insulating material or different insulating material. According to an embodiment of the present invention, the material layer 22 could be a semiconductor substrate or an interlayer dielectric (ILD) layer or inter-metal dielectric (IMD) layer on the semiconductor substrate, and the material layer 24 is preferably an IMD layer, but not limited thereto. A plurality of contact plugs could be formed in the material layer 22 and 24, in which the contact plugs 26 disposed in the material layer 24 are electrically connected and physically contacting the top electrode 18, the contact plugs 28 disposed in the material layer 24 are electrically connected and physically contacting the middle electrodes 14, and the contact plugs 30 disposed in the material layer 22 are electrically connected and physically contacting the bottom electrode 12. It should be noted that the quantity of the contact plugs 30 is not limited to the embodiment shown in FIG. 2. For instance, it would also be desirable to form only one single contact plug 30 in the material layer 22 to electrically and physically connected to the bottom electrode 12, which is also within the scope of the present invention.

Figure 3:
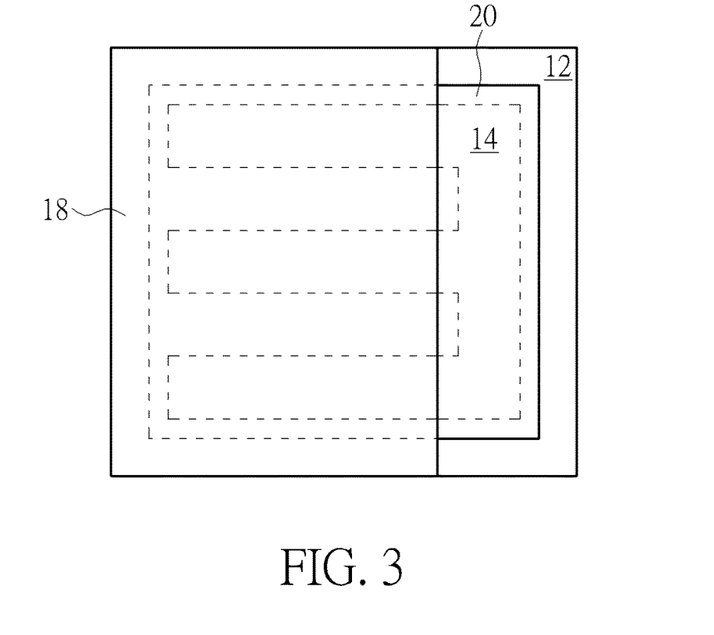
FIGS. 3-5 illustrate top views of a capacitor according to other embodiments of the present invention.
Figure 4:
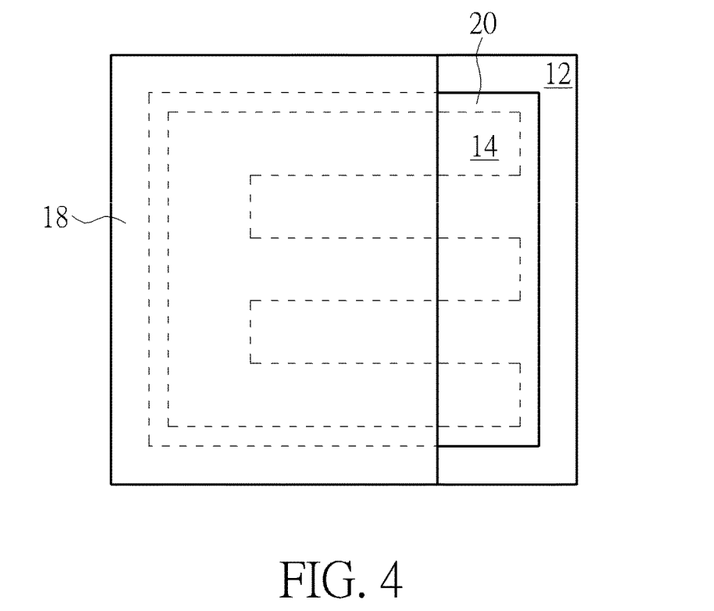
Figure 5:
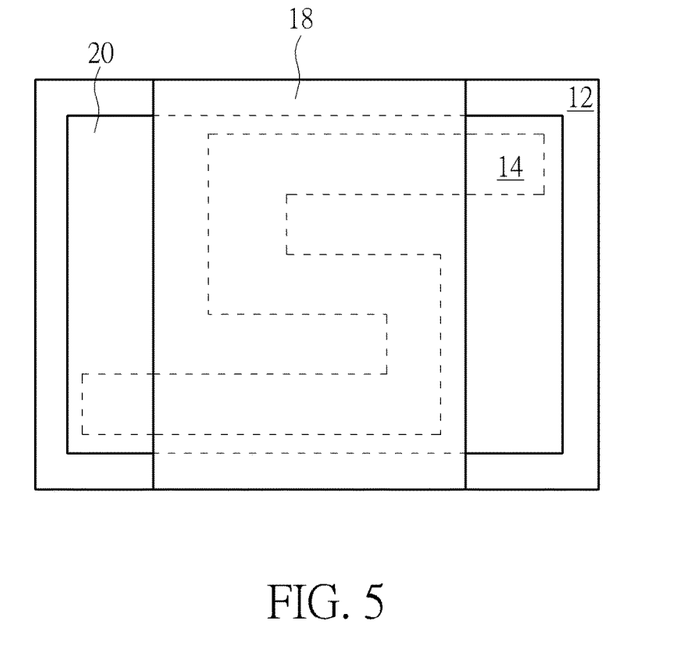

Referring to FIGS. 3-5, FIGS. 3-5 illustrate top views of a capacitor according to other embodiments of the present invention. As shown in FIG. 3, the middle electrode 14 is preferably composed of a connecting portion and multiple finger-shaped branches, the top electrode 18 is disposed on the branches of the middle electrode 14 but not on the connecting portion, and the second capacitor dielectric layer 20 is disposed on the connecting portion of the middle electrode 14. In contrast to FIG. 3, the top electrode 18 shown in FIG. 4 is preferably covering the connecting portion and part of the branches of the middle electrode 14, and the second capacitor dielectric layer 20 only covers part of the branches of the middle electrode 14. In the embodiment shown in FIG. 5, the middle electrode 14 is preferably S-shaped, the top electrode 18 is disposed on the central portion of the middle electrode 14, and two ends of the middle electrode 14 are disposed on both left and right sides of the top electrode 18.

Figure 6:
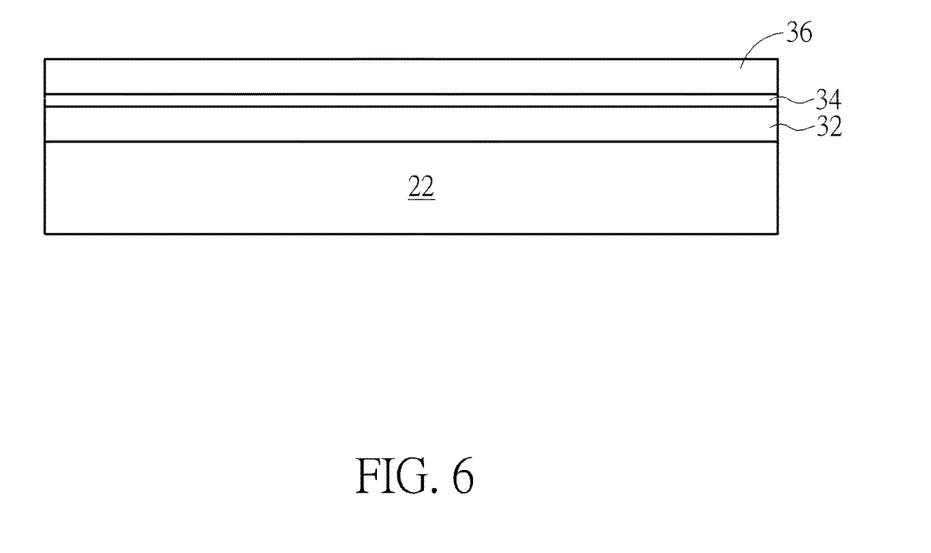
FIGS. 6-10 illustrate a method for fabricating the capacitor shown in FIG. 1 according to a preferred embodiment of the present invention.

Referring to FIGS. 6-10, FIGS. 6-10 illustrate a method for fabricating the capacitor shown in FIG. 1 according to a preferred embodiment of the present invention. As shown in FIG. 6, a material layer 22, such as a semiconductor substrate composed of silicon or a dielectric layer disposed on the semiconductor substrate is provided, and devices such as metal-oxide semiconductor (MOS) transistors, oxide-semiconductor field-effect-transistors (OS FETs), CMOS transistors, FinFETs, or other active devices could be disposed on the semiconductor substrate. The dielectric layer could be a ILD layer or a IMD layer covering active devices, in which metal interconnections could be formed within the dielectric layer to electrically connect to the active devices on the semiconductor substrate.

Next, a first conductive layer 32, a first dielectric layer 34, and a second conductive layer 36 are sequentially formed on the material layer 22, in which the first conductive layer 32 is preferably used to form the aforementioned bottom electrode 12 and the second conductive layer 36 is used to form the aforementioned middle electrodes 14. In this embodiment, the first conductive layer 32 and second conductive layer 36 could be composed of same material or different material, in which the conductive layers 32 and 36 could be selected from the group consisting of W, Ti, TiN, Ta, TaN, and Al. The first dielectric layer 34 is preferably composed of dielectric material having low current leakage characteristics. For instance, the first dielectric layer 34 could be selected from the group consisting of oxide-nitride-oxide (ONO), silicon nitride, silicon oxide, and silicon oxynitride.

According to an embodiment of the present invention, the first dielectric layer 34 could also include a high-k dielectric layer having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Figure 7:
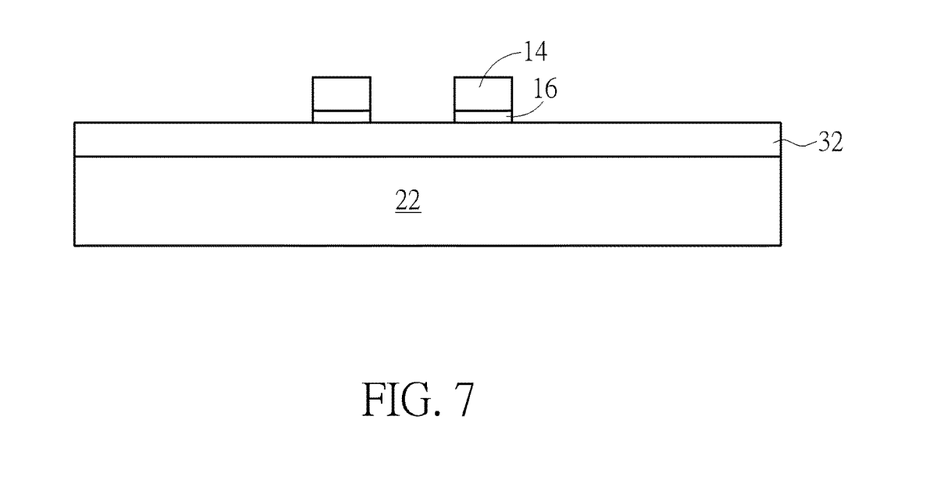

Next, as shown in FIG. 7, the second conductive layer 36 and first dielectric layer 34 are patterned to form a patterned second conductive layer and a patterned first dielectric layer, in which the patterned second conductive layer preferably being the middle electrodes 14 shown in FIG. 1 while the patterned first dielectric layer being the capacitor dielectric layer 16 shown in FIG. 1. In this embodiment, the patterning of the second conductive layer 36 and first dielectric layer 34 could be accomplished by a photo-etching process. For instance, a patterned mask (not shown) could be formed on the second conductive layer 36, and an etching process is conducted to remove part of the second conductive layer 36 and part of first dielectric layer 34 not covered by the patterned mask to form strip-shaped middle electrodes 14 on the first conductive layer 32 and first capacitor dielectric layer 16 between the first conductive layer 32 and middle electrodes 14.

Figure 8:
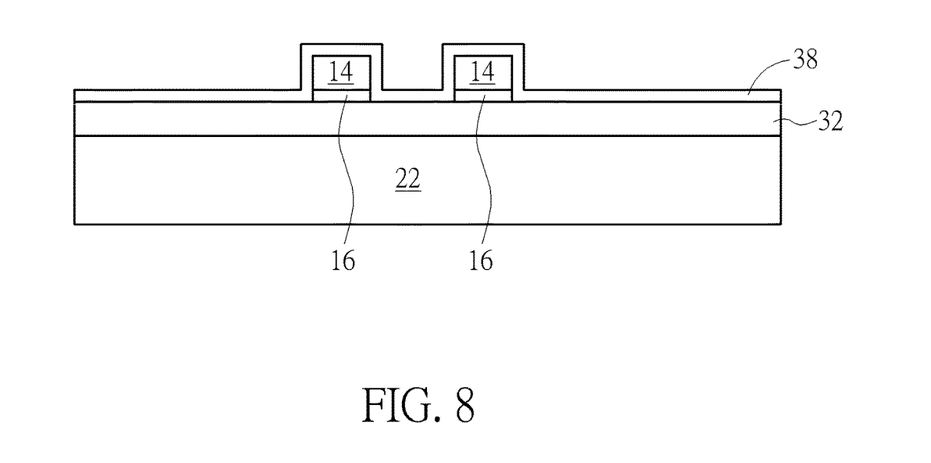

Next, as shown in FIG. 8, a second dielectric layer 38 is formed on the first conductive layer 32 and middle electrodes 14 and contact the first capacitor dielectric layer 16. In this embodiment, the second dielectric layer 38 and the first dielectric layer 34 could be composed of same material or different material. For instance, the second dielectric layer 38 could be composed of aforementioned dielectric material having low current leakage or high-k dielectric layer having high dielectric constant. It should be noted that since the second dielectric layer 38 covers the first conductive layer 32 and middle electrodes 14 at the same time, the second dielectric layer 38 preferably covers the top surface, front and back sidewalls, and left and right sidewalls of the middle electrodes 14 and all the top surface of first conductive layer 32 outside the middle electrodes 14.

Figure 9:
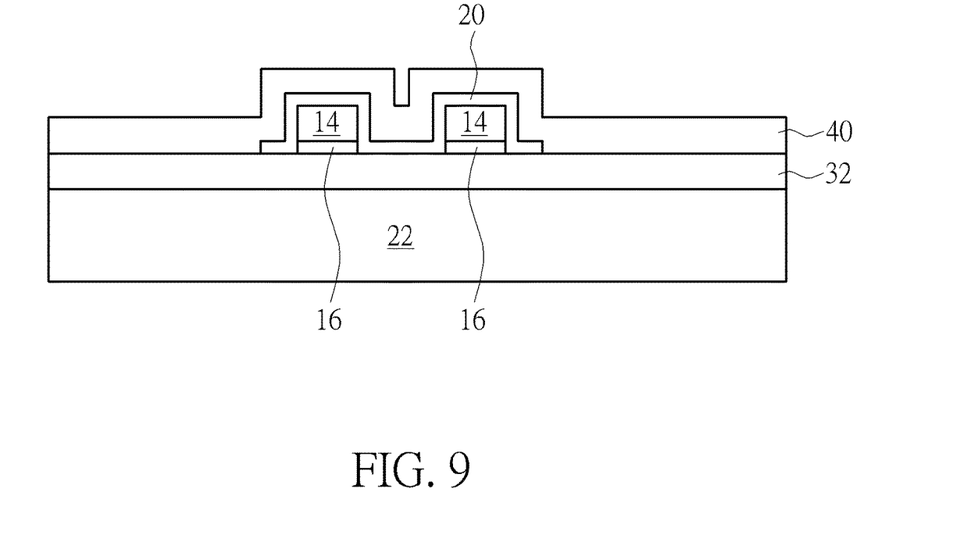

Next, as shown in FIG. 9, an etching process is conducted to remove part of the second dielectric layer 38 to form a patterned second dielectric layer or the second capacitor dielectric layer 20 and expose part of the top surface of first conductive layer 32 at the same time. A third conductive layer 40 is then formed on the first conductive layer 32 and second capacitor dielectric layer 20, in which the third conductive layer 40 is preferably used to form the top electrode 18 shown in FIG. 1. It should be noted that since part of the top surface of first conductive layer 32 is exposed during the patterning of second dielectric layer 38, the deposited third conductive layer 40 preferably contacts the exposed top surface of the first conductive layer 32.

In this embodiment, the material of the third conductive layer 40 could be the same as or different the second conductive layer 36 and/or first conductive layer 32. For instance, the third conductive layer 40 could be selected from the group consisting of W, Ti, TiN, Ta, TaN, and Al, but not limited thereto.

Figure 10:
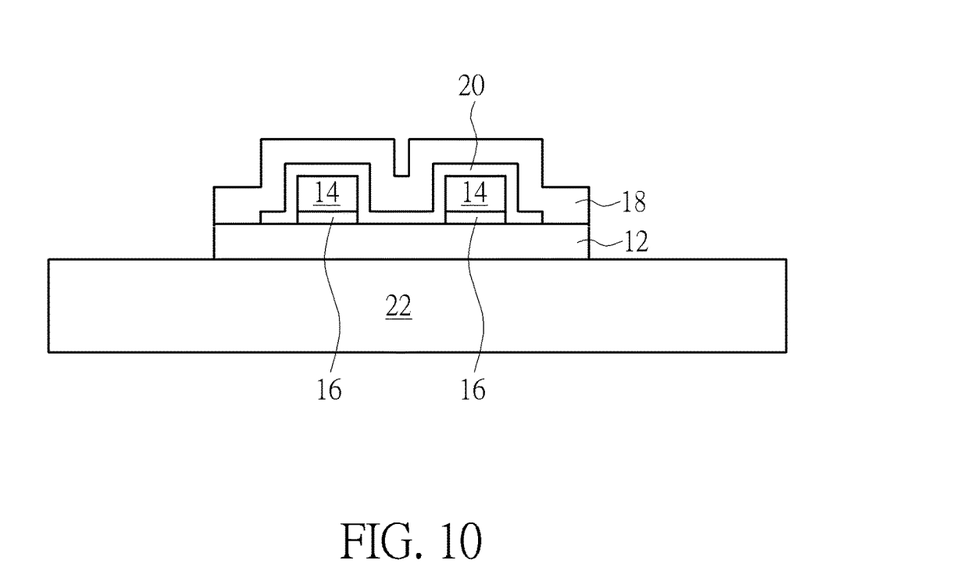

Next, as shown in FIG. 10, a photo-etching process is conducted to remove part of the third conductive layer 40 and expose part of the second capacitor dielectric layer 20, or more specifically, as shown in FIG. 1, part of the second capacitor dielectric layer 20 and part of middle electrodes 14 that were embedded within the third conductive layer 40 are exposed after the photo-etching process.

Next, the third conductive layer 40 and first conductive layer 32 are patterned by conducting another photo-etching process to remove part of the third conductive layer 40 and part of the first conductive layer 32 for defining the size of the capacitor. This forms the top electrode 18 and bottom electrode 12 shown in FIG. 1 and completes the fabrication of a capacitor according to a preferred embodiment of the present invention.

Next, as shown in FIG. 2, another material layer 24 is formed on the material layer 22 and covering the entire capacitor, in which the material layer 24 could be a IMD layer or dielectric layer composed of any other dielectric material. Next, contact plugs 26 and 28 are formed in the material layer 24 to electrically connect and physically contact the top electrode 18 and middle electrodes 14. The bottom electrode 12 is electrically connected to the contact plugs 30 that were already formed in the material layer 22. It should be noted since the top electrode 18 and bottom electrode 12 were already contacting each other, it would be desirable to form only the contact plug connected to the top electrode 18 or only the contact plug connected to the bottom electrode 12 in addition to the contact plug 20 connected to the middle electrodes.

Overall, the present invention first forms a first conductive layer, a first dielectric layer, and a second conductive layer on a material layer, patterns the first dielectric layer and second conductive layer to forma first capacitor dielectric layer and middle electrode, forms a second capacitor dielectric layer on the middle electrode, forms a third conductive layer on the first conductive layer and middle electrode so that the third conductive layer contacts the first conductive layer directly, and finally patterns the third conductive layer and first conductive layer to form a 3-dimensional capacitor having high density. Preferably, the 3D capacitor of the present invention not only possesses much greater capacitor density compare to conventional capacitor, but could also be integrated to random access memory (RAM) devices with oxide semiconductor FETs to achieve much smaller volume and lower current leakage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor, comprising:
    a bottom electrode having a continuous planar top surface;
    a first dielectric layer directly on the continuous planar top surface of the bottom electrode;
    a middle electrode layer directly on the first dielectric layer, wherein the middle electrode layer and the first dielectric layer are simultaneously patterned into a first stack laterally adjacent to a second stack, directly on the continuous planar top surface of the bottom electrode, each of the first stack and the second stack having vertical sidewalls,
    wherein the simultaneously patterning yields identical patterns for the first dielectric layer and the middle electrode layer from an overhead view, such that each of the vertical sidewalls of the first stack is planar and each of the sidewalls of the second stack is planar;
    a second dielectric layer directly on and conformally covering each of the first stack, the second stack, and the continuous planar top surface of the bottom electrode, wherein the second dielectric layer is patterned to expose a peripheral portion of the continuous planar top surface of the bottom electrode;
    a top electrode directly on and conformally covering a first portion of each of the first stack, the second stack, the second dielectric layer and the exposed peripheral portion of the continuous planar top surface of the bottom electrode, and
    wherein the top electrode is patterned to expose a second portion of each of the first stack, the second stack, the second dielectric layer and the exposed peripheral portion of the continuous planar top surface of the bottom electrode.

2. The capacitor of claim 1, wherein an edge of the top electrode is aligned with an edge of the bottom electrode.

3. The capacitor of claim 1, wherein three edges of the top electrode are aligned with three edges of the bottom electrode.

4. The capacitor of claim 1, further comprising a first contact plug contacting the first stack and the second stack.

5. The capacitor of claim 1, further comprising a second contact plug contacting the top electrode.

6. The capacitor of claim 1, further comprising a second contact plug contacting the bottom electrode.

7. The capacitor of claim 1, wherein the first dielectric layer is selected from the group consisting of oxide-nitride-oxide (ONO), silicon nitride, silicon oxide, and silicon oxynitride.

8. The capacitor of claim 1, wherein the first dielectric layer comprises a high-k dielectric layer.

9. The capacitor of claim 1, wherein the second dielectric layer is selected from the group consisting of oxide-nitride-oxide (ONO), silicon nitride, silicon oxide, and silicon oxynitride.

10. The capacitor of claim 1, wherein the second dielectric layer comprises a high-k dielectric layer.

* * * * *